United States Patent
Lai (10) Patent No.: US 7,499,141 B2
(45) Date of Patent: Mar. 3, 2009

(54) DISPLAY PANELS WITH RC DELAY COMPENSATION IN SIGNAL LINES

(75) Inventor: Ming-Sheng Lai, Taipei (TW)

(73) Assignee: Au Optronics Corp., Hsinchu (TW)

( * ) Notice: Subject to any disclaimer, the term of this patent is extended or adjusted under 35 U.S.C. 154(b) by 397 days.

(21) Appl. No.: 11/322,061

(22) Filed: Dec. 29, 2005

(65) Prior Publication Data

US 2007/0080433 A1 Apr. 12, 2007

(30) Foreign Application Priority Data

Oct. 6, 2005 (TW) .............................. 94134941 A (51) Int. Cl.
  *G02F 1/1345* (2006.01)
(52) U.S. Cl. ...................... 349/149; 349/150; 349/151; 349/152; 257/59; 257/72
(58) Field of Classification Search ............... 257/59, 257/72, 666; 349/149, 150, 151, 152
  See application file for complete search history.

(56) References Cited

U.S. PATENT DOCUMENTS

| | | | |
|---|---|---|---|
| 6,774,414 B2 | 8/2004 | Chang | |
| 6,842,200 B1 * | 1/2005 | Su et al. | ........................ 349/38 |
| 7,271,871 B2 * | 9/2007 | Jen et al. | ..................... 349/152 |
| 2002/0060833 A1 * | 5/2002 | Yamaguchi | .................. 359/245 |
| 2003/0086048 A1 | 5/2003 | Ukita | |

FOREIGN PATENT DOCUMENTS

| | | |
|---|---|---|
| CN | 1194252 | 3/2005 |
| CN | 1628263 | 6/2005 |

OTHER PUBLICATIONS

CN Office Action mailed Mar. 2, 2007.

* cited by examiner

*Primary Examiner*—Jerome Jackson, Jr.
*Assistant Examiner*—Anthony Ho
(74) *Attorney, Agent, or Firm*—Thomas, Kayden, Horstemeyer & Risley (57) ABSTRACT

A display panel comprising a substrate, signal lines, bonding pads, connecting leads, and capacitance compensating devices. The signal lines are disposed on the substrate. The bonding pads are disposed in a bonding area on the substrate and connected to a driver. The connecting leads are arranged in a fan configuration. Lengths of the connecting leads gradually decrease from the outside to the inside of the fan configuration. Each connecting lead is connected between the bonding pad and the signal line and has a compensating section, and lengths of the compensating sections are equal. Each capacitance compensating device is coupled to the compensating section of the corresponding connecting lead. The compensating values of the capacitance compensating devices gradually increase from the outside to the inside of the fan configuration.

4 Claims, 15 Drawing Sheets

DISPLAY PANELS WITH RC DELAY COMPENSATION IN SIGNAL LINES

BACKGROUND

The invention relates to a display panel, and in particular to a display panel compensating RC delay in signal lines.

Typically, a display panel of a conventional liquid crystal display (LCD) device comprises a plurality of scan lines and a plurality of data lines. The scan lines are interlaced with the data lines to form an active area. A plurality of pixel electrodes and a plurality of thin film diodes or thin film transistors are formed in the active area. A scan driver and a data driver respectively provide scan signals and data signals to the scan lines and the data lines through a plurality of bonding pads. The bonding pads are assembled to form bonding areas. Each bonding area is typically connected to a fanout area having a plurality of leads to connect the scan lines and data lines respectively to the scan driver and data driver.

Figure 1:
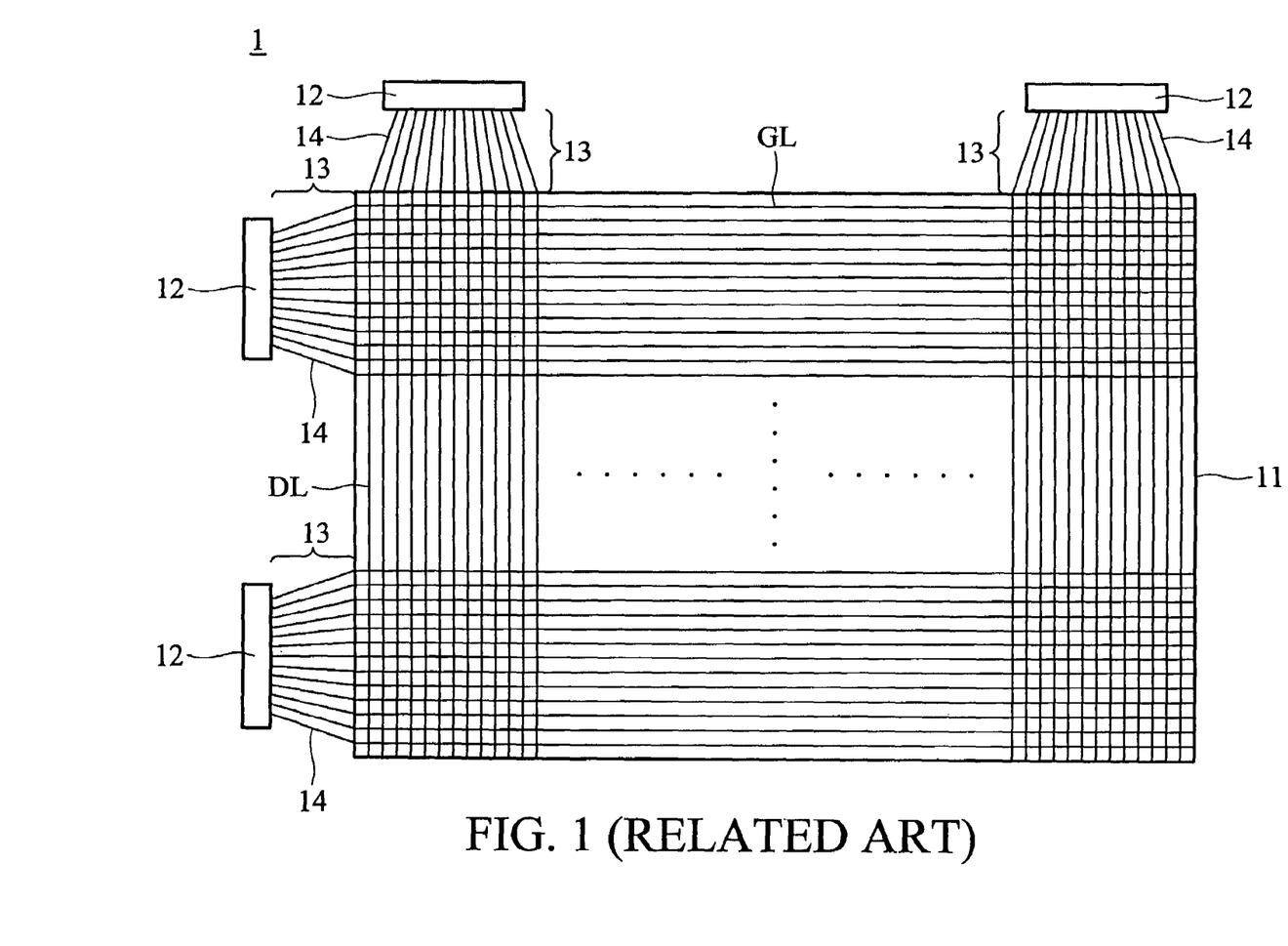
FIG. 1 shows a display panel of a conventional LCD device.

FIG. 1 is a display panel of a conventional LCD device. A display panel 1 comprises a plurality of scan lines GL and a plurality of data lines DL. The scan lines GL are interlaced with the data lines DL in an active area 11. A plurality of bonding pads are formed in a plurality of bonding areas 12 near the periphery of the active area 11. In order to connect the scan lines GL and data lines DL to the bonding pads in the bonding areas 12, a plurality of fanout areas 13 are formed between the bonding areas 12 and the active area 11. Each fanout area 13 comprises a plurality of leads 14 connecting the scan lines GL and data lines DL to the corresponding bonding pads. Referring to FIG. 1, in each fanout area 13, the distances between the leads 14 gradually decrease from the active area 11 to the bonding area 12. Thus, in each fanout area 13, the lengths of the leads 14 gradually decrease from the outside to the inside of the fanout area 13, so that the resistance (R) and the coupled capacitance (C) gradually decrease from the outside to the inside thereof, resulting in different RC delays between the leads 14. The difference in RC delays causes degraded image qualities, such as undesirable mura defects.

SUMMARY

An exemplary embodiment of a display panel comprises a substrate, a plurality of signal lines, a plurality of bonding pads, a plurality of connecting leads, and a plurality of capacitance compensating devices. The substrate has a bonding area. The signal lines are disposed on the substrate. The bonding pads are disposed in the bonding area and connected to a driver. The connecting leads are arranged in a fan configuration. Lengths of the connecting leads gradually decrease from the outside to the inside of the fan configuration. Each connecting lead is connected between the bonding pad and the signal line and has a compensating section, and lengths of the compensating sections are equal. Each capacitance compensating device is coupled to the compensating section of the corresponding connecting lead. The compensating values of the capacitance compensating devices gradually increase from the outside to the inside of the fan configuration.

An exemplary embodiment of a display panel comprises a substrate, a plurality of signal lines, a driver, a plurality of bonding pads, and a plurality of connecting leads. The substrate has a bonding area. The signal lines are disposed on the substrate. The driver comprises an output circuit for outputting a plurality of signals. The bonding pads are disposed in the bonding area and connected to the output circuit. Each connecting lead is connected between the bonding pad and the signal line. The driver further comprises a compensating device providing resistance and/or capacitance compensation to the signals.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 2:
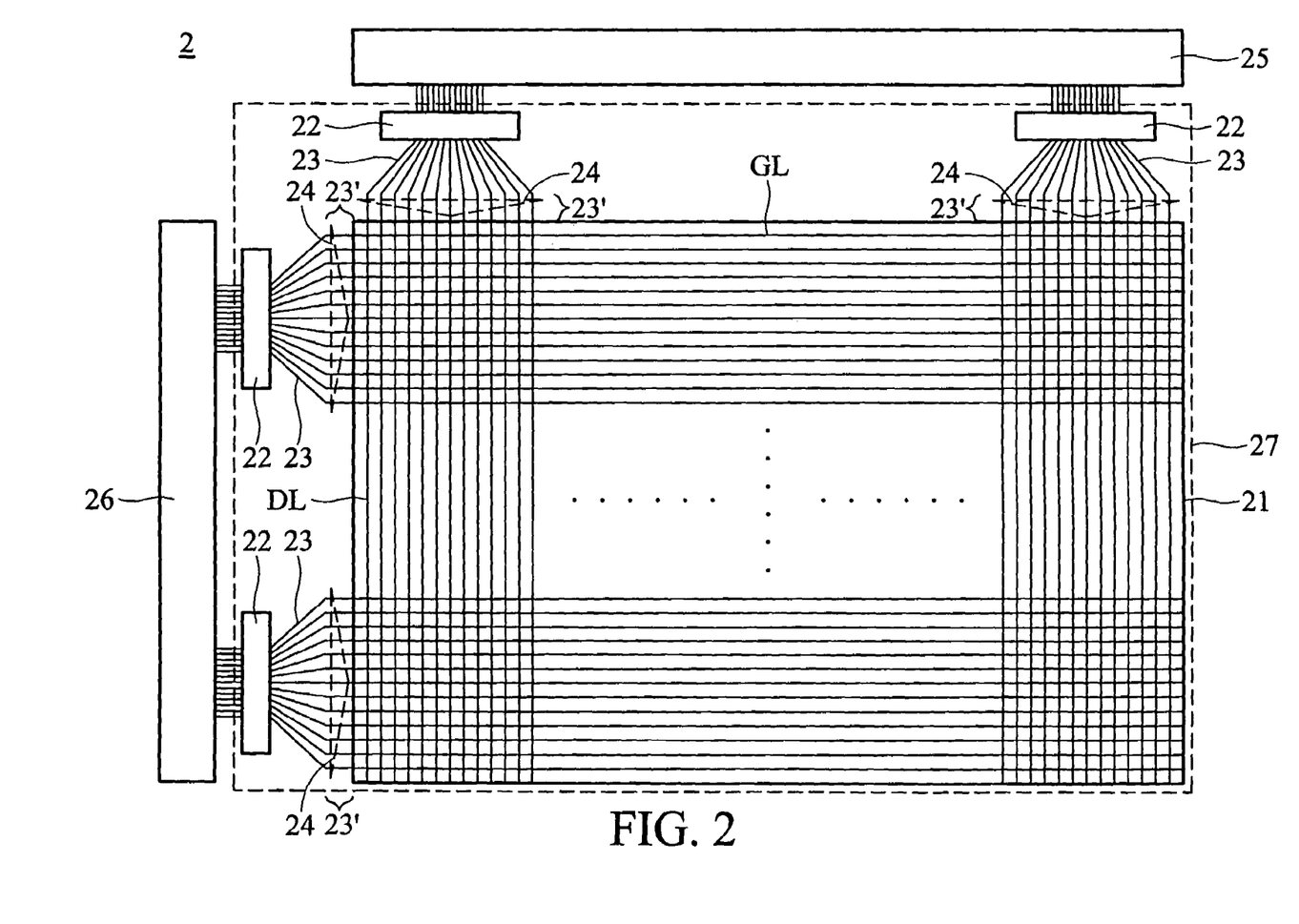
FIG. 2 shows an embodiment of a display panel.

In an exemplary embodiment of a display panel shown in FIG. 2, a display panel 2 comprises an active area 21 formed by interlaced signal lines. As shown in FIG. 2, a plurality of scan lines GL and a plurality of data lines DL are disposed in a substrate 27 and interlaced to form the active area 21. A plurality of bonding areas 22 are formed near the periphery of the active area 21 and connected to a scan driver 25 and a data driver 26. A plurality of bonding pads are disposed in each bonding area 22. In order to provide signals to the scan lines GL and data lines DL from the scan driver 25 and data driver 26, a plurality of connecting leads 23 are formed between the bonding areas 22 and the active area 21. Each connecting leads 23 is connected between one signal line and the corresponding bonding pad. For each bonding area 22, the corresponding connecting leads 23 are arranged in a fan configuration, and the lengths of the connecting leads 23 gradually decrease from the outside to the inside of the fan configuration, so that the resistance (R) and the coupled capacitance (C) gradually decreases from the outside to the inside thereof. Each connecting lead 23 has a compensating section 23', and the lengths of the compensating sections 23' are equal. In FIG. 2, the compensating sections 23' are straight lines. For each bonding area 22, capacitance compensating devices 24 are coupled to the compensating sections 23', and the compensating values of the capacitance compensating devices 24 gradually increase from the outside to the inside of the fan configuration.

Figure 3:
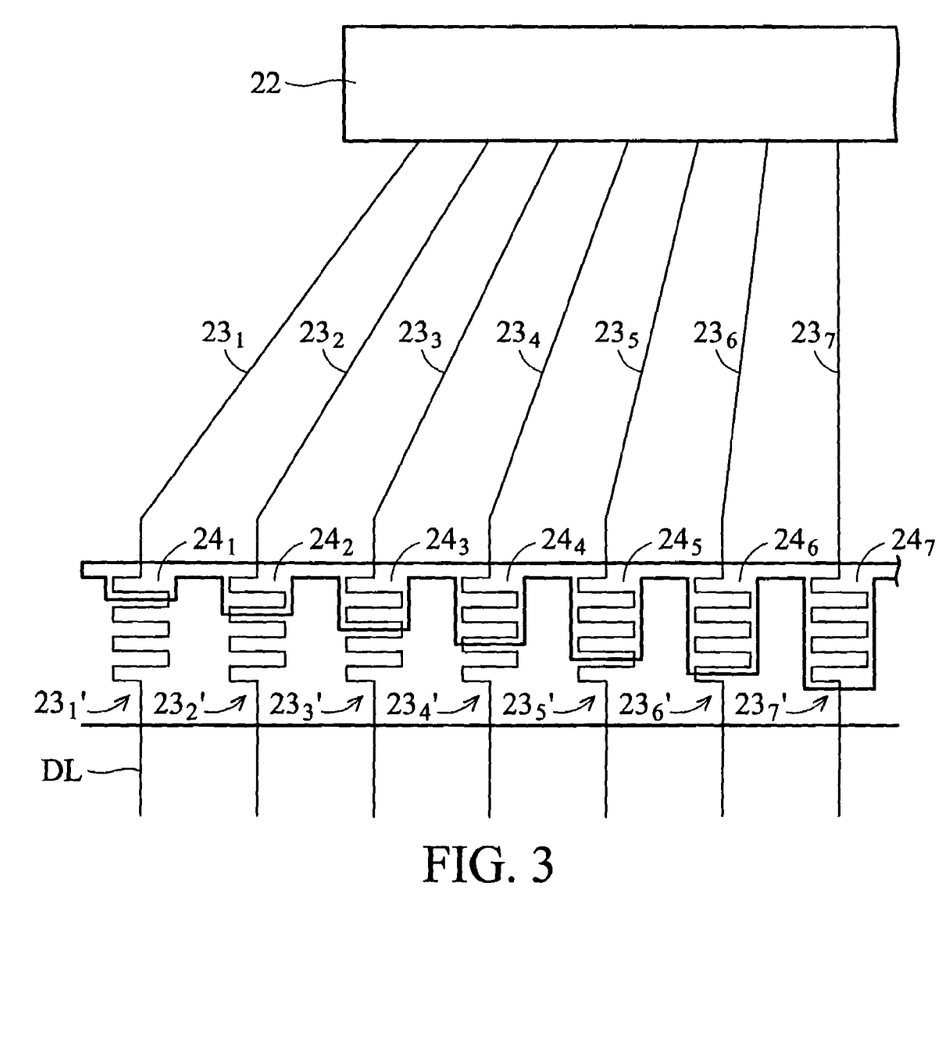
FIG. 3 is a detailed diagram of the connecting leads in FIG. 2.

In following description, the connecting leads 23 between the data lines DL and the bonding area 22 are given as an example. Referring to FIG. 3, there are seven connecting leads $23_1$ to $23_7$. One terminal of each of the connecting leads $23_1$ to $23_7$ is connected to the same bonding area 22, and the other terminal thereof is connected to the corresponding data line DL. The connecting leads $23_1$ to $23_7$ respectively have compensating sections $23'_1$ to $23'_7$, and the lengths of the compensating sections $23'_1$ to $23'_7$ are equal. The capacitance compensating devices $24_1$ to $24_7$ are respectively coupled to the compensating sections $23'_1$ to $23'_7$. The compensating values of the capacitance compensating devices $24_1$ to $24_7$ gradually increase from the outside to the inside of the fan configuration. The coupled capacitance (C) of the connecting leads $23_1$ to $23_7$ is adjusted by the compensating values of the capacitance compensating devices $24_1$ to $24_7$, degrading the difference between the RC delays of the connecting leads $23_1$ to $23_7$.

Referring to FIG. 3, the lengths of the compensating sections $23'_1$ to $23'_7$ are equal, and the compensating sections $23'_1$ to $23'_7$ are formed by the corresponding parts of the connecting leads $23_1$ to $23_7$ and have serpentine shapes. The capacitance compensating devices $24_1$ to $24_7$ are formed by conductors coupled in series. As shown in FIG. 3, the areas of the regions in which the conductors are coupled to the compensating sections $23'_1$ to $23'_7$ gradually increase from the outside to the inside of the fan configuration, thus, the compensating values of the capacitance compensating devices $24_1$ to $24_7$ gradually increase from the outside to the inside thereof.

Figure 4:
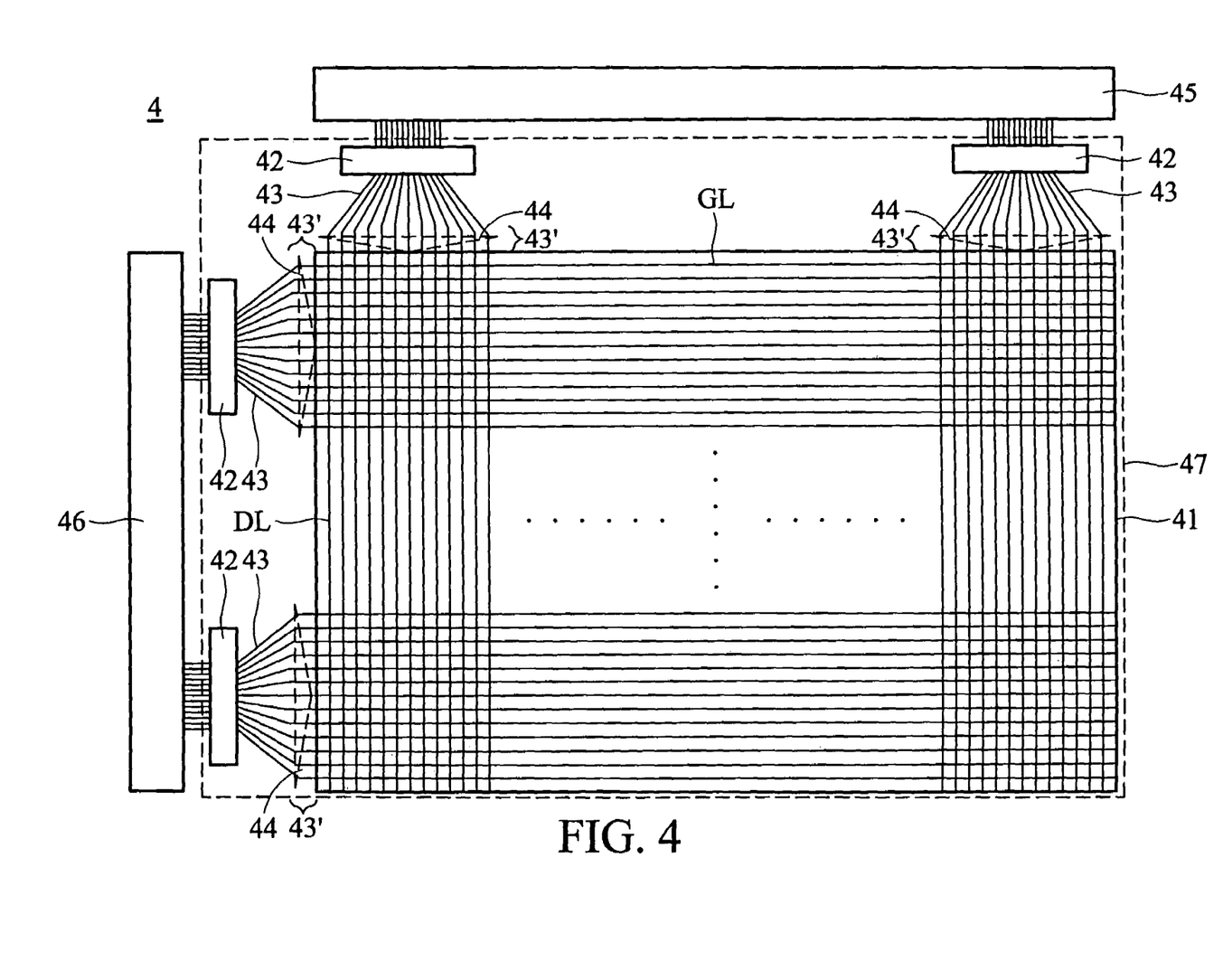
FIG. 4 shows an embodiment of an embodiment of a display panel.

In an exemplary embodiment of a display panel in FIG. 4, a display panel 4 comprises an active area 21 formed by interlaced signal lines. As shown in FIG. 4, a plurality of scan lines GL and a plurality of data lines DL are disposed in a substrate 47 and interlaced to form the active area 41. A plurality of bonding areas 42 are formed near the periphery of the active area 41 and connected to a scan driver 45 and a data driver 46. A plurality of bonding pads are gathered in each bonding area 42. In order to provide signals to the scan lines GL and data lines DL from the scan driver 45 and data driver 46, a plurality of connecting leads 43 are formed between the bonding areas 42 and the active area 41. Each connecting lead 43 is connected between one signal line and the corresponding bonding pad. For each bonding area 42, the corresponding connecting leads 43 are arranged in a fan configuration. Each connecting lead 43 has a compensating section 43'. The lengths of compensating sections 43' gradually increase from the outside to the inside of the fan configuration, so that the resistance of the connecting leads 43 is compensated. A plurality of capacitance compensating devices 44 are coupled to the compensating sections 43', and the compensating values of the capacitance compensating devices 44 gradually increase from the outside to the inside of the fan configuration, thus, the capacitance of the connecting leads 43 is compensated.

Figure 5:
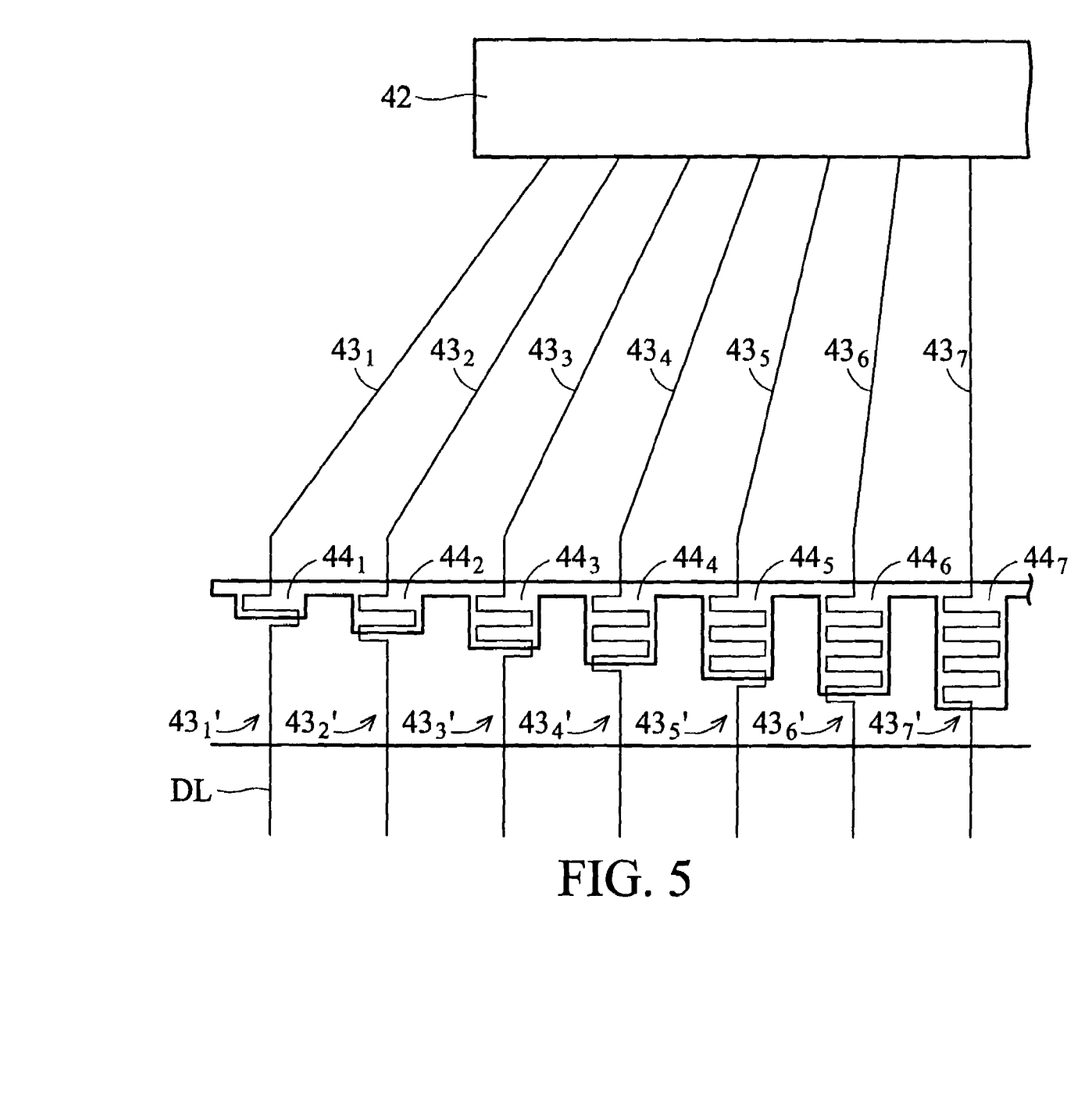
FIG. 5 shows a detailed diagram of the connecting leads in FIG. 4.

In followed description, the connecting leads 43 between the data lines DL and the bonding area 42 are given as an example. Referring to FIG. 5, one terminal of each of the connecting leads $43_1$ to $43_7$ is connected to the same bonding area 42, and the other terminal thereof is connected to the corresponding data line DL. The connecting leads $43_1$ to $43_7$ respectively have compensating sections $43'_1$ to $43'_7$, and the lengths of the compensating sections $43'_1$ to $43'_7$ gradually increase from the outside to the inside of the fan configuration. The capacitance compensating devices $44_1$ to $44_7$ are respectively coupled to the compensating sections $43'_1$ to $43'_7$. The compensating values of the capacitance compensating devices $44_1$ to $44_7$ gradually increase from the outside to the inside of the fan configuration. The resistance (R) and the coupled capacitance (C) of the connecting leads $43_1$ to $43_7$ are adjusted by the lengths of the compensating sections $43'_1$ to $43'_7$ and the compensating values of the capacitance compensating devices $44_1$ to $44_7$, degrading the difference between the RC delays of the connecting leads $43_1$ to $43_7$. As described above, the compensating values of the capacitance compensating devices $44_1$ to $44_7$ and the lengths of the compensating sections $43'_1$ to $43'_7$ are in direct proportion.

Referring to FIG. 5, the lengths of the compensating sections $43'_1$ to $43'_7$ gradually increase from the outside to the inside of the fan configuration, and the compensating sections $43'_1$ to $43'_7$ are formed by the corresponding parts of the connecting leads $43_1$ to $43_7$ and have serpentine shapes. The capacitance compensating devices $44_1$ to $44_7$ are formed by conductors coupled in series. As shown in FIG. 5, the areas of regions in which the conductors are coupled to the compensating sections $43'_1$ to $43'_7$ gradually increase from the outside to the inside of the fan configuration, thus, the compensating values of the capacitance compensating devices $44_1$ to $44_7$ gradually increase from the outside to the inside thereof. In other words, the lengths of the compensating sections $43'_1$ to $43'_7$ and the areas of the regions in which the conductors are coupled to the compensating sections $43'_1$ to $43'_7$ in direct proportion.

Figure 6:
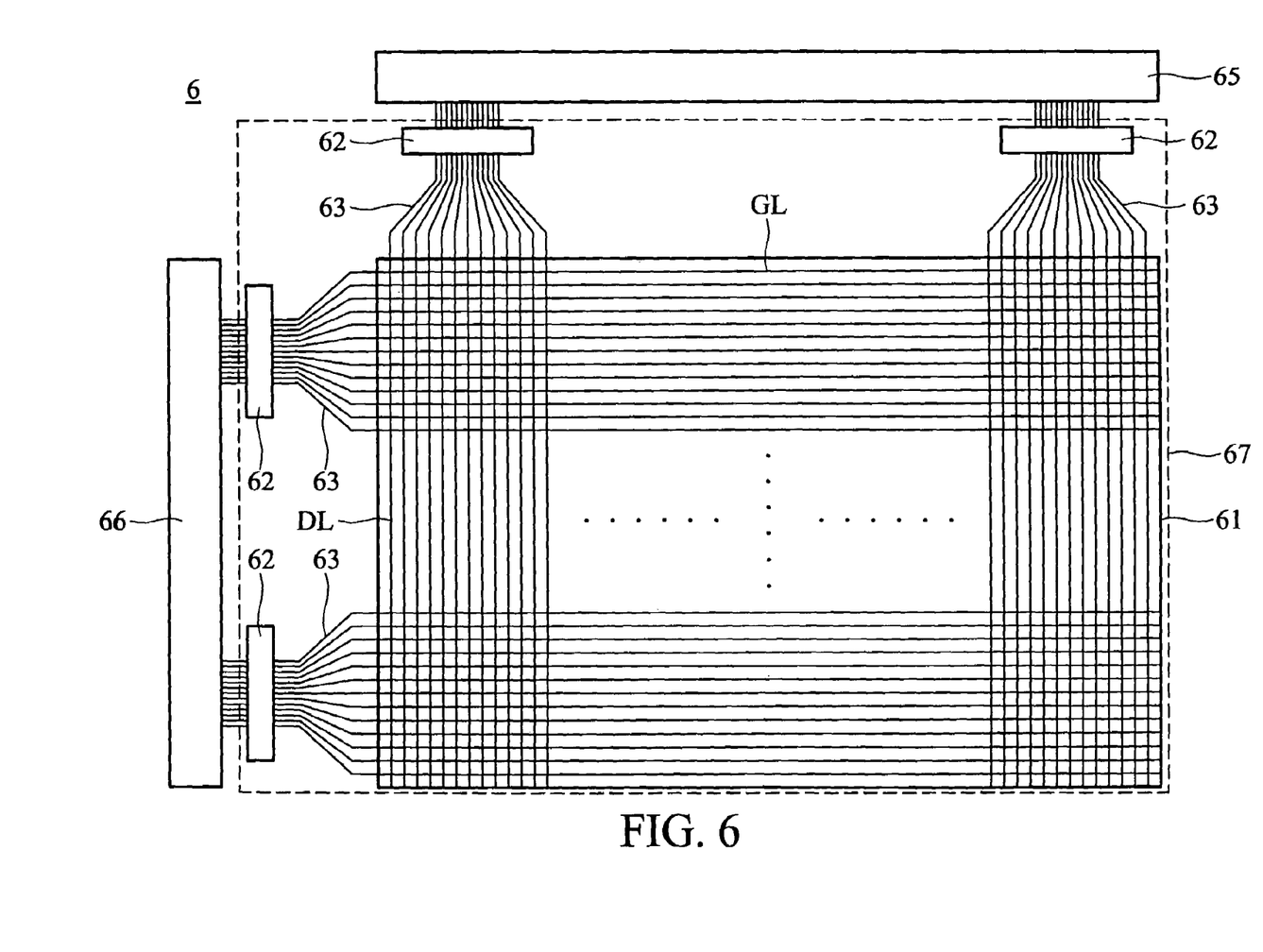
FIG. 6 shows an embodiment of a display panel.

In an exemplary embodiment of a display panel in FIG. 6, a display panel 6 comprises an active area 61 formed by interlaced signal lines. As shown in FIG. 6, a plurality of scan lines GL and a plurality of data lines DL are disposed in a substrate 67 and interlaced to form the active area 61. A plurality of bonding areas 62 are formed near the periphery of the active area 61 and connected to a scan driver 65 and a data driver 66. A plurality of bonding pads are gathered in each bonding area 62. In order to provide signals to the scan lines GL and data lines DL from the scan driver 65 and data driver 66, a plurality of connecting leads 63 are formed between the bonding areas 62 and the active area 61. Each connecting lead 63 is connected between one signal line and the corresponding bonding pad. For each bonding area 62, the corresponding connecting leads 63 are arranged in a fan configuration. Each connecting lead 43 comprises three sections.

Figure 7:
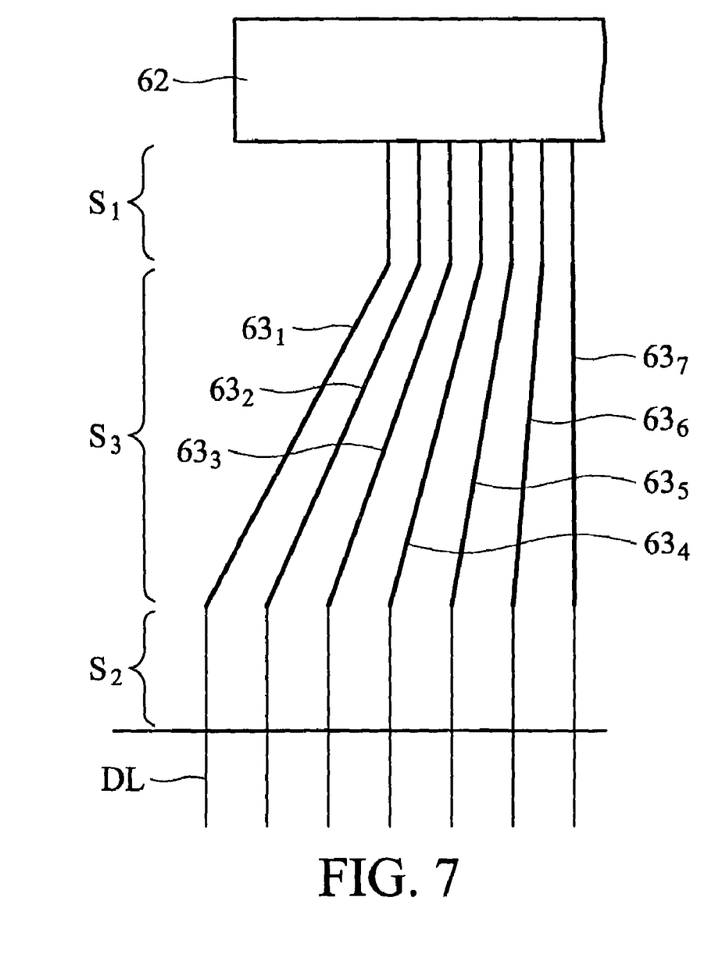
FIG. 7 shows an example of the widths of the first, second, and third sections of the connecting leads in FIG. 6.

In following description, the connecting leads 63 between the data lines DL and the bonding area 62 are given as an example. Referring to FIG. 7, each of the connecting leads $63_1$ to $63_7$ comprises a first section $S_1$, a second section $S_2$, and a third section $S_3$. The widths of the first sections $S_1$ of the connecting leads $63_1$ to $63_7$ are equal, the widths of the second sections $S_2$ thereof are equal, and the widths of the third sections $S_3$ thereof are equal. For each connecting lead, such as the connecting leads $63_1$, the first section $S_1$ is connected to the bonding pad of the corresponding bonding area 62, the second section $S_2$ is connected to the corresponding data line, and the third section $S_3$ is connected between the first section $S_1$ and the second section $S_2$. In the embodiment of FIG. 7, the width of the third section $S_3$ is different from the widths of the first section $S_1$ and the second section $S_2$. Moreover, the widths of the first section $S_1$ and the second section $S_2$ are equal, and the widths thereof are less than the width of the third section $S_3$. In other embodiments, the widths of the first section $S_1$ and the second section $S_2$ can be unequal.

Figure 8:
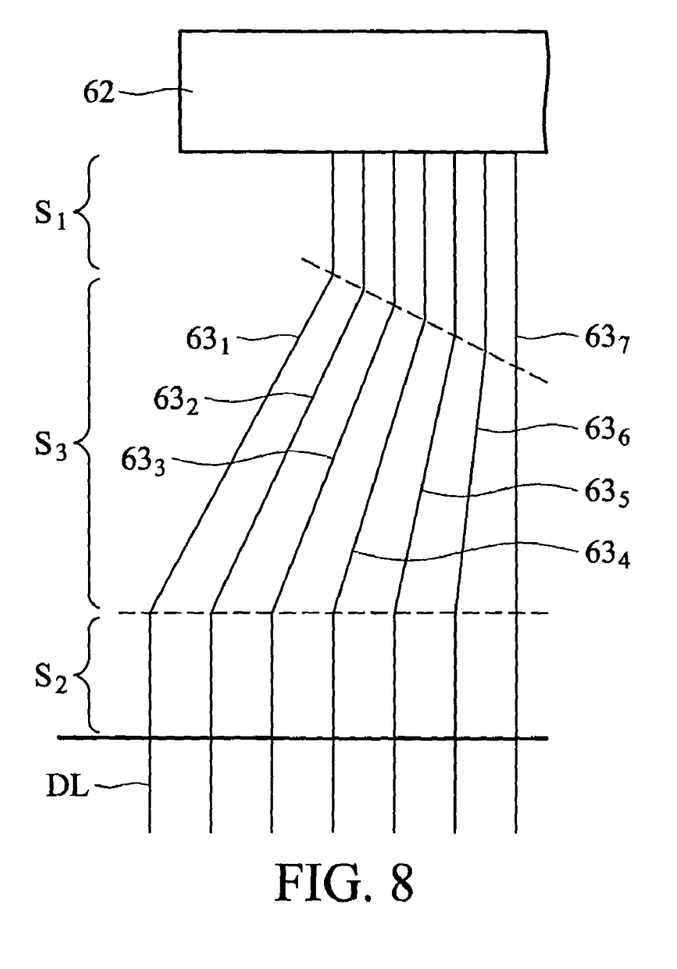
FIGS. 8 and 9 show examples of the lengths of the first, second, and third sections of the connecting leads in FIG. 6.
Figure 9:
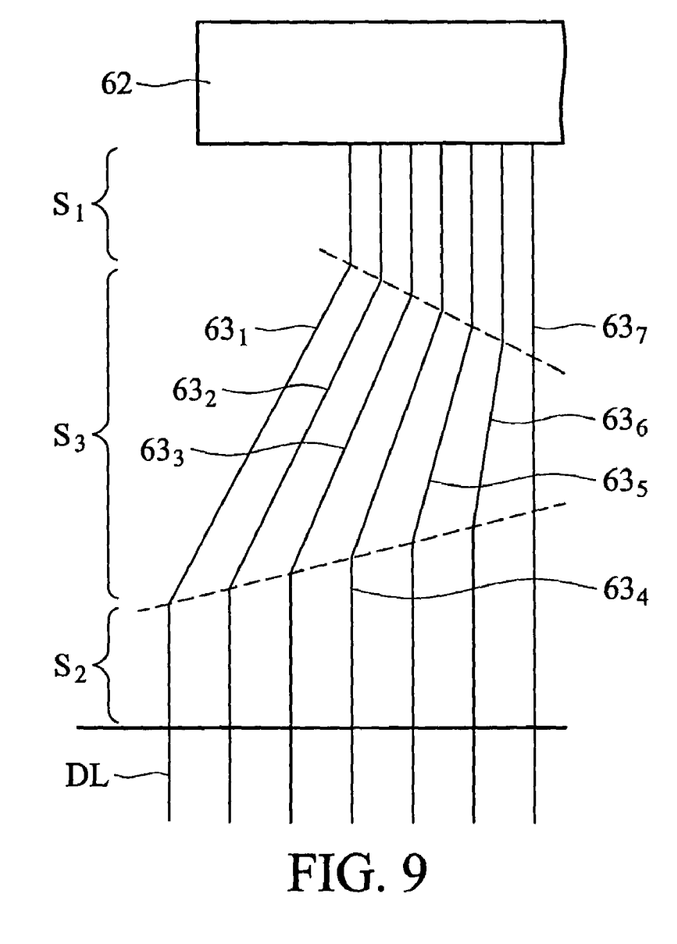

In the embodiment of FIG. 8, the lengths of the first sections $S_1$ gradually increase from the outside to the inside of the fan configuration, and the lengths of the third sections $S_3$ gradually decrease from the outside to the inside thereof. The lengths of the second sections $S_2$ are equal in the embodiment of FIG. 8. The lengths of the second sections $S_2$ gradually increase from the outside to the inside of the fan configuration in the embodiment of FIG. 9.

Figure 10A:
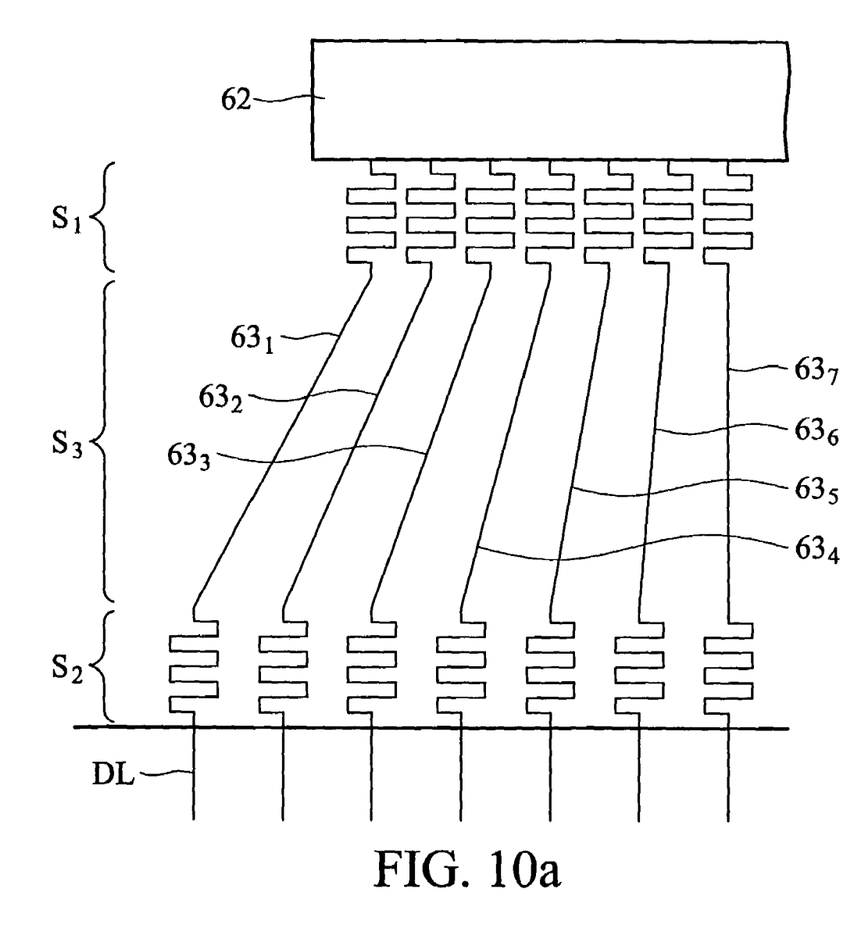
FIGS. 10a-10c show examples of the shapes of the first and second sections of the connecting leads in FIG. 6.
Figure 10B:
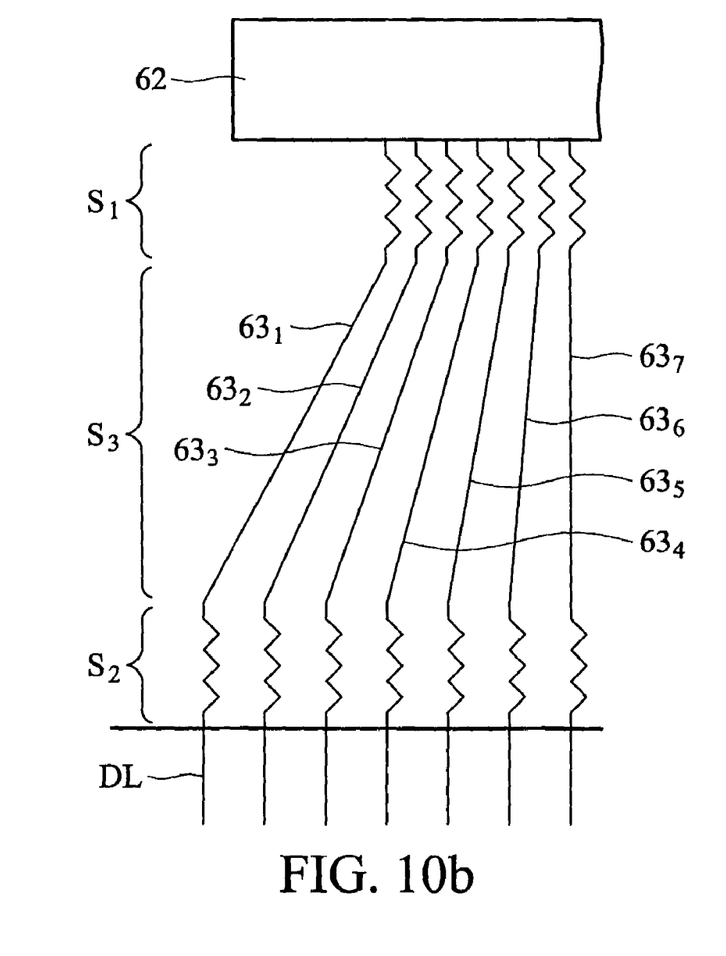
Figure 10C:
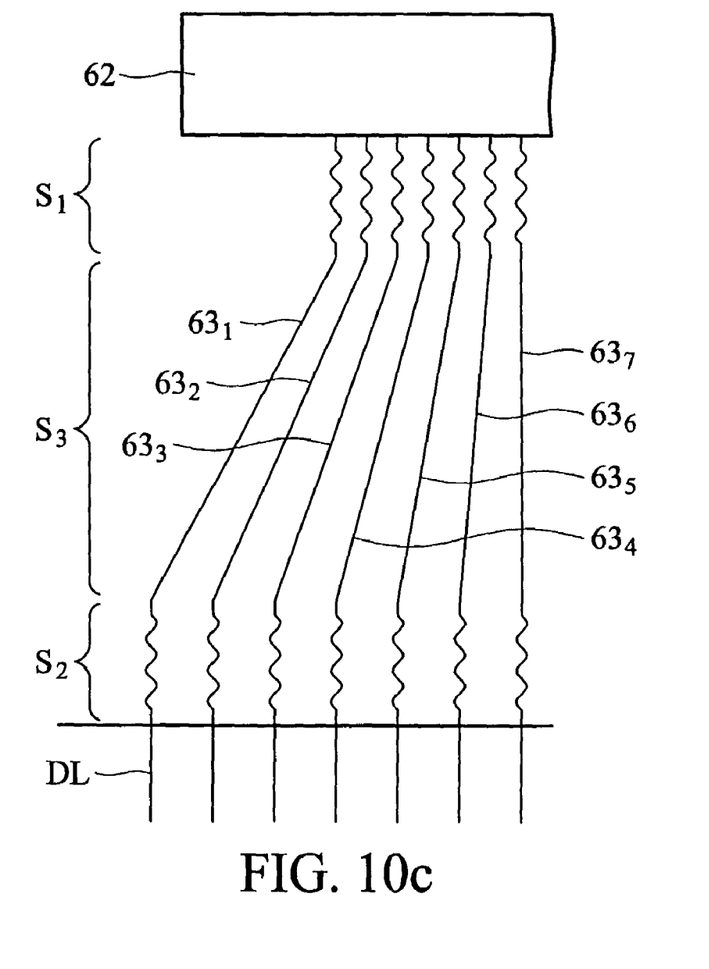

The first sections $S_1$ and the second sections $S_2$ have various shapes. Referring to FIG. 10a, the first sections $S_1$ and the second sections $S_2$ can have serpentine shapes. Referring to FIG. 10b, the first sections $S_1$ and the second sections $S_2$ can have a saw-tooth profile. Referring to FIG. 10c, the first sections $S_1$ and the second sections $S_2$ can have wavelike shapes. Accordingly, the resistance (R) of the connecting lead $63_1$ to $63_7$ is adjusted by varying the lengths and widths of the sections $S_1$, $S_2$, and $S_3$.

Figure 11:
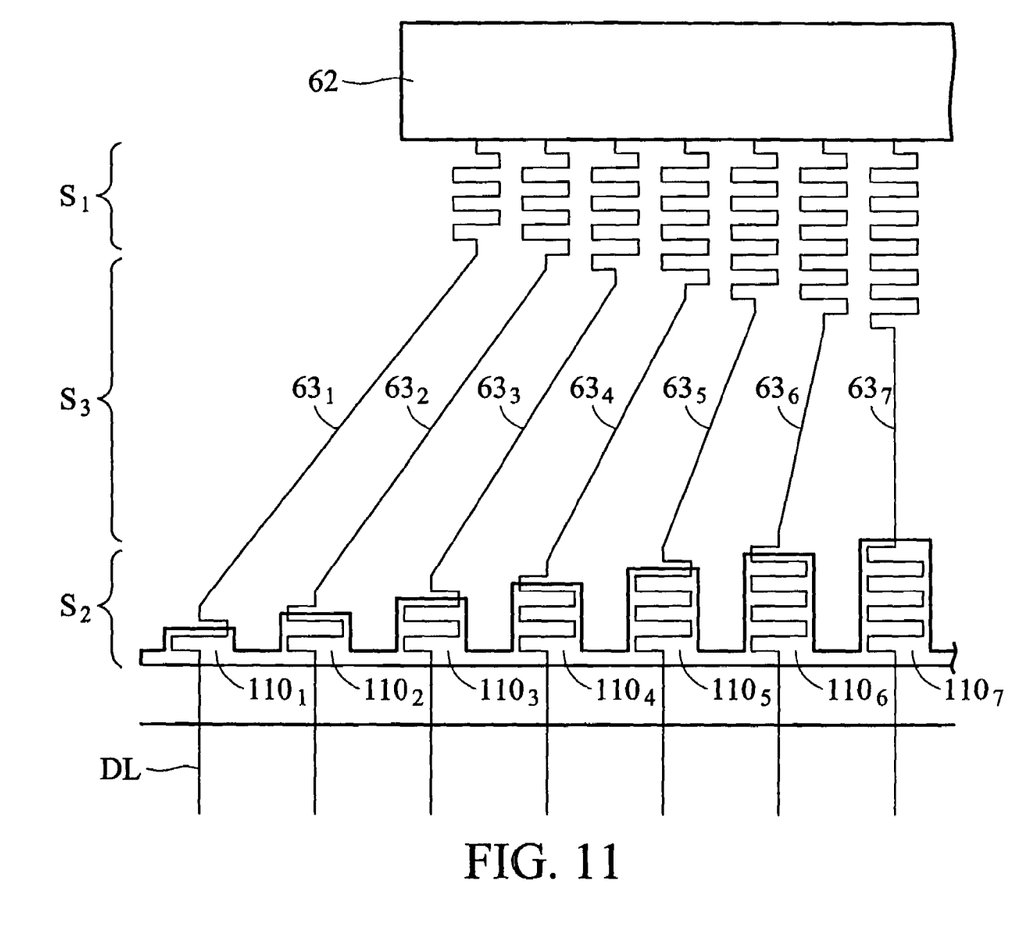
FIG. 11 shows the capacitance compensating devices coupled to the second sections in FIG. 6.
Figure 12:
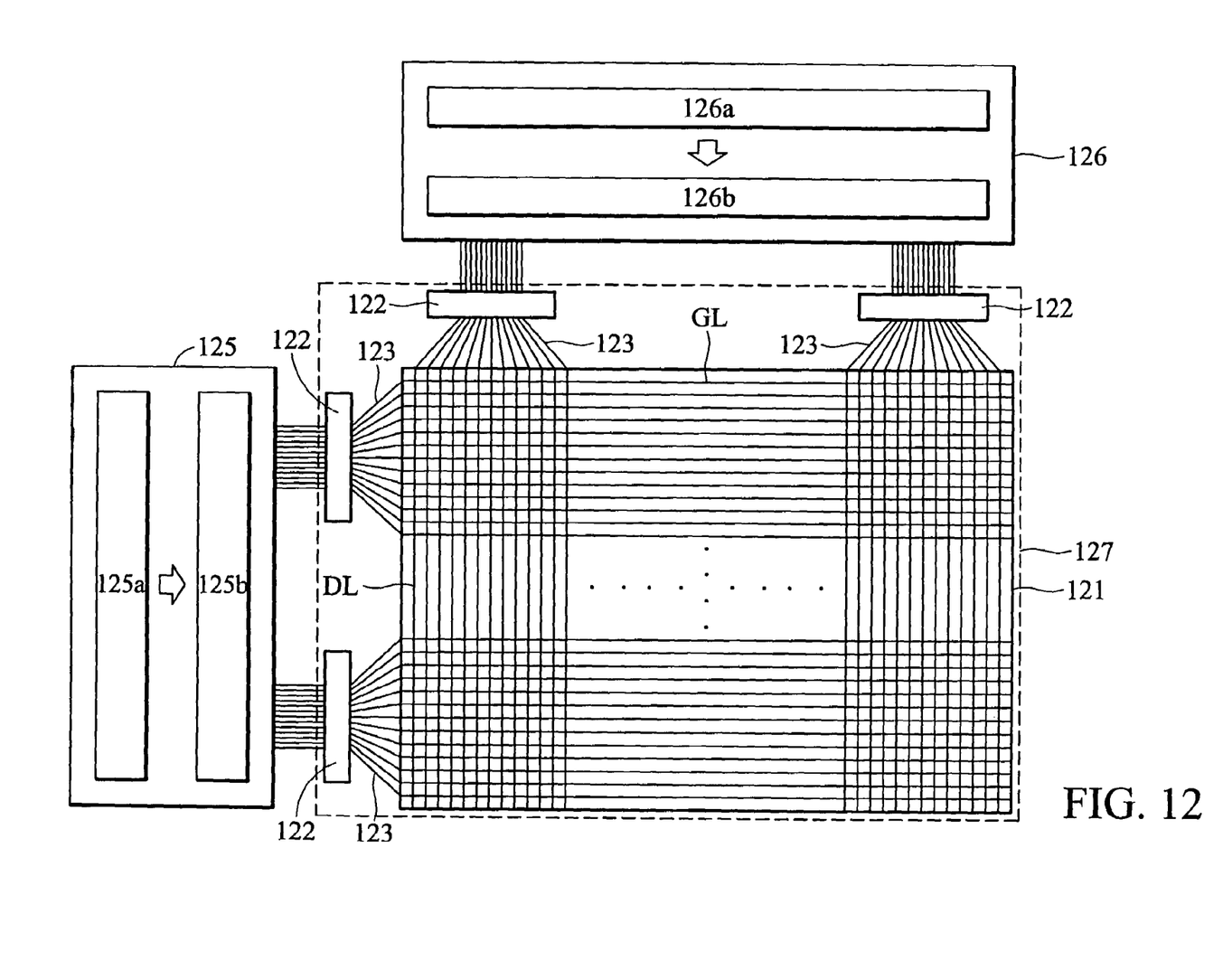
FIG. 12 shows an embodiment of an embodiment of a display panel.

Referring to FIG. 11, capacitance compensating devices $110_1$ to $110_7$ coupled in series are respectively coupled to second sections $S_2$ of the connecting leads $63_1$ to $63_7$. The compensating values of the capacitance compensating devices $110_1$ to $110_7$ and the lengths of the corresponding second sections $S_2$ are in direct proportion. In FIG. 11, the lengths of the second sections $S_2$ gradually increase from the outside to the inside of the fan configuration, and the compensation values of the capacitance compensating devices $110_1$ to $110_7$ also gradually increase from the outside to the inside thereof. The capacitance compensating devices $110_1$ to $110_7$ are formed by conductors coupled in series. Referring to FIG. 11, the areas of regions in which the conductors are coupled to the compensating sections $43'_1$ to $43'_7$ gradually increase from the outside to the inside of the fan configuration, so that the compensation values of the capacitance compensating devices $110_1$ to $110_7$ gradually increase from the outside to the inside thereof.

Thus, the resistance (R) and the coupled capacitance (C) of the connecting lead $63_1$ to $63_7$ are adjusted by varying the lengths and widths of the sections $S_1$, $S_2$, and $S_3$ and the compensation values of the capacitance compensating devices $110_1$ to $110_7$, degrading the difference between the RC delays of the connecting leads $63_1$ to $63_7$.

In an exemplary embodiment of a display panel in FIG. 11, RC delays can be compensated by compensating devices of a scan driver and a data driver. Referring to FIG. 11, a display panel 120 comprises an active area 121 formed by interlaced signal lines. As shown in FIG. 11, a plurality of scan lines GL and a plurality of data lines DL are disposed in a substrate 127 and interlaced to form the active area 61. A plurality of bonding areas 162 are formed near the periphery of the active area 121 and connected to a scan driver 125 and a data driver 126. A plurality of bonding pads are gathered in each bonding area 122. In order to provide signals to the scan lines GL and data lines DL from the scan driver 125 and data driver 126, a plurality of connecting leads 123 are formed between the bonding areas 122 and the active area 121. Each connecting leads 123 is connected between one signal line and the corresponding bonding pad. For each bonding area 122, the corresponding connecting leads 123 are arranged in a fan configuration, and the lengths of the connecting leads 123 gradually decrease from the outside to the inside of the fan configuration, so that the resistance (R) and the coupled capacitance (C) gradually decrease from the outside to the inside thereof.

Figure 13A:
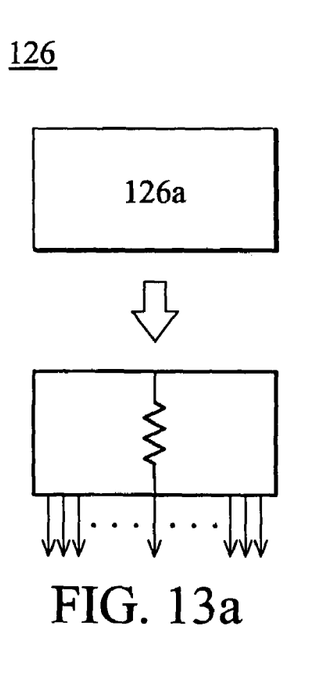
FIGS. 13a-13c show examples of the compensating devices of the drivers in FIG. 12.
Figure 13B:
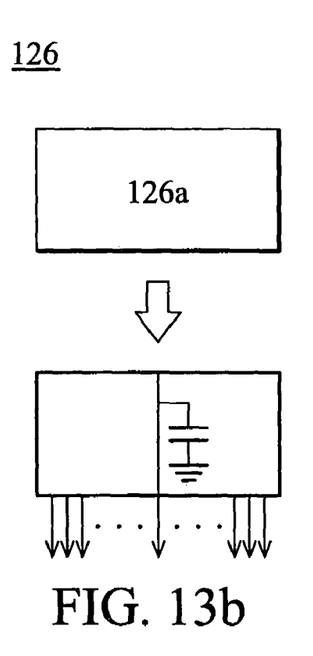
Figure 13C:
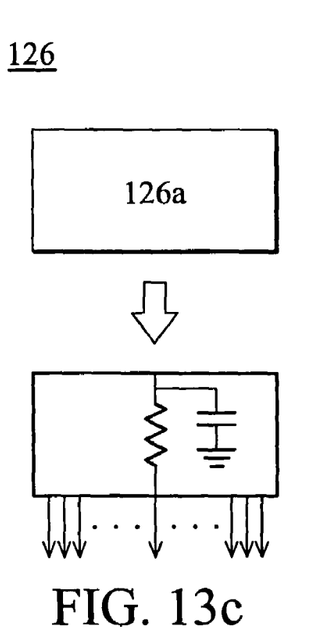

Both scan driver 125 and data driver 126 comprise output circuits 125a and 126a. In the following description, the data driver 126 is given as an example. The output circuit 126a of the data driver 126 outputs data signals to the connecting leads 123. The data driver 126 further comprises a compensating device 126b providing resistance (R) and/or capacitance (C) to the connecting leads 123, so that the unequal RC delays of the data signals can be compensated. In the embodiment of FIG. 13a, the compensating device 126b only provides resistance (R). In the embodiment of FIG. 13b, the compensating device 126b only provides capacitance (C). In the embodiment of FIG. 13c, the compensating device 126b provides resistance (R) and capacitance (C). Similarly, the scan driver 125 further comprises a compensating device 125b providing resistance (R) and/or capacitance (C) to the connecting leads 123, so that the unequal RC delays of scan signals can be compensated.

In the embodiment of FIG. 11, the unequal RC delays can further be compensated by varying the lengths and widths of the connecting leads 123. For example, the widths of the connecting leads 123 gradually increase from the outside to the inside of the fan configuration.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A display panel comprising:
   a substrate having a bonding area;
   a plurality of signal lines disposed on the substrate;
   a plurality of bonding pads disposed in the bonding area and connected to a driver;
   a plurality of connecting leads arranged in a fan configuration, wherein each connecting lead is connected between the bonding pad and the signal line and has a compensating section, and lengths of the compensating sections gradually increase from the outside to the inside of the fan configuration; and
   a plurality of capacitance compensating devices overlapping the compensation sections respectively, wherein the areas of the capacitance compensating devices gradually increase from the outside to the inside of the fan configuration.

2. The display panel as claimed in claim 1, wherein each compensating section is formed by one part of the corresponding connecting lead and have a serpentine shape.

3. The display panel as claimed in claim 2, wherein the capacitance compensating devices are formed by a plurality of conductors coupled in series.

4. The display panel as claimed in claim 1, wherein each of the compensating sections comprises a serpentine part, and each of the capacitance compensating devices only overlaps the serpentine part of the corresponding compensating section.

* * * * *